US009354507B2

(12) United States Patent
Shih et al.

(10) Patent No.: US 9,354,507 B2
(45) Date of Patent: May 31, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Chih-Tsung Shih, Hsinchu (TW); Shinn-Sheng Yu, Hsinchu (TW); Jeng-Horng Chen, Hsin-Chu (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 13/963,451

(22) Filed: Aug. 9, 2013

(65) Prior Publication Data
US 2014/0272682 A1 Sep. 18, 2014

Related U.S. Application Data

(60) Provisional application No. 61/781,587, filed on Mar. 14, 2013.

(51) Int. Cl.
*G03F 1/24* (2012.01)
*G03F 1/22* (2012.01)
*G03F 7/20* (2006.01)

(52) U.S. Cl.
CPC ............... *G03F 1/22* (2013.01); *G03F 7/2004* (2013.01)

(58) Field of Classification Search
CPC ...................................... G03F 1/22; G03F 1/24
USPC ........................................................ 430/5, 322
See application file for complete search history.

(56) References Cited

U.S. PATENT DOCUMENTS 8,765,330 B2 7/2014 Shih et al.
2009/0317728 A1* 12/2009 Oh et al. ........................... 430/5

OTHER PUBLICATIONS

T. Sato, K. Miura, N. Ishino, Y. Ohtera, T. Tamamura and S. Kawakami, Photonic Crystals for the Visible Range Fabricated by Autocloning Technique and Their Application, Optical and Quantum Electronics, 2002, vol. 34: 63-70, Kluwer Academic Publishers, the Netherlands.

* cited by examiner

*Primary Examiner* — Stephen Rosasco
(74) *Attorney, Agent, or Firm* — Haynes and Boone, LLP

(57) ABSTRACT

The present disclosure is directed towards an extreme ultraviolet (EUV) mask. The EUV mask includes a low thermal expansion material (LTEM) substrate. The EUV mask has a first region and a second region. The EUV mask also includes a structure disposed in the first region. The structure has a multiple facets with an angle to each other. The EUV mask also includes a conformal reflective multilayer (ML) disposed over the structure in the first region and over the LTEM substrate in the second region. The conformal reflective ML has a similar surface profile as the structure in the first region and a flat surface profile in the second region.

20 Claims, 6 Drawing Sheets

EXTREME ULTRAVIOLET LITHOGRAPHY PROCESS AND MASK

This patent claims the benefit of U.S. Ser. No. 61/781,587 filed Mar. 14, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm, and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, a shadowing effect of the mask becomes a more severe issue in EUV lithography. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
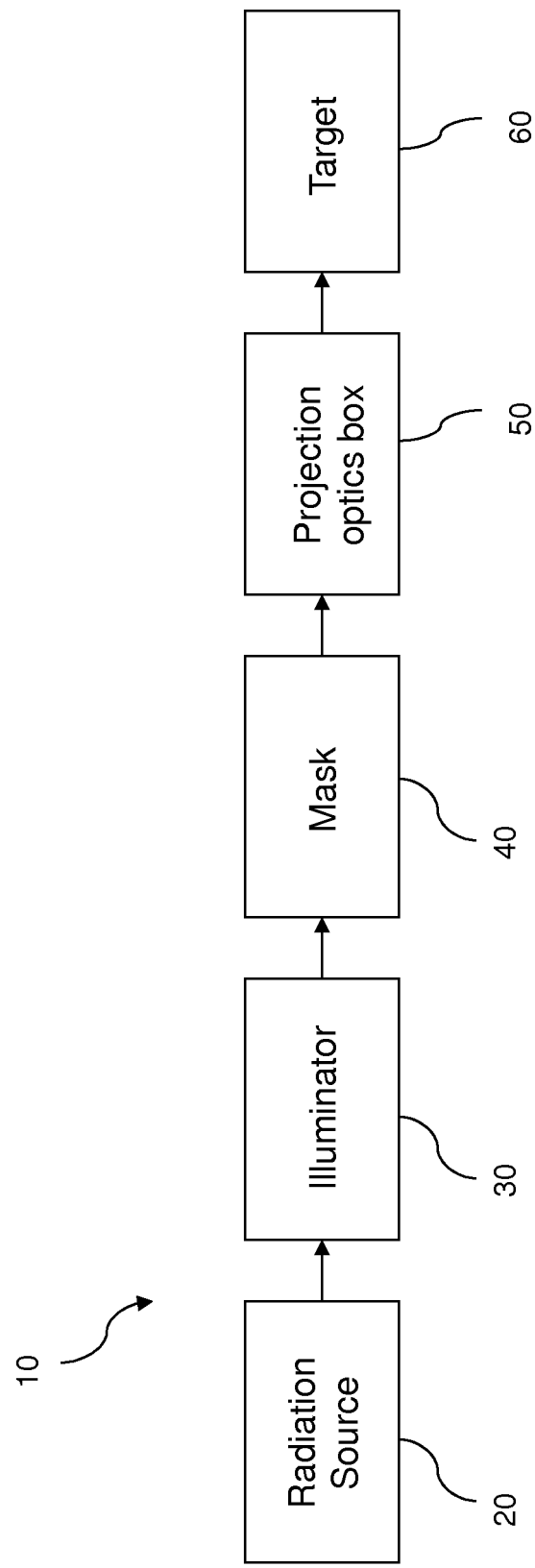
FIG. 1 is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present disclosure is disclosed. The EUV lithography process 10 employs an EUV radiation source 20 having a wavelength of about 1-100 nm, including an EUV wavelength of about 13.5 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask. In the EUV wavelength range, reflective optics is employed generally.

The EUV lithography process 10 also employs a mask 40 (in the present disclosure, the terms mask, photomask, and reticle are used to refer to the same item). The mask 40 can be a transmissive mask or a reflective mask. The mask 40 contains patterns used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity masks (BIM) and phase-shifting masks (PSM). An example BIM includes an almost totally absorptive region (also referred to as a dark region) and a reflective region (the reflective region is also opaque.). In the dark region, an absorber is present and an incident light beam is almost fully absorbed by the absorber. In order to achieve enough optical density, the thickness of the absorption layer is usually sufficiently large, e.g. 80 nm. When the thickness of the absorption layer is accompanied by a chief ray angle of incidence at the object side (CRAO) not close to zero, shadows beside mask patterns are created, referred to as the shadowing effect. The shadowing effect may cause aerial image contrast loss, which will reduce the process window and increase the mask error enhancement factor (MEEF). The shadowing effect becomes more severe when we go to smaller technology nodes if the thickness of the absorption layer is kept the same. The depicted disclosure presents an approach to reduce/or eliminate the shadow defect.

The following description will be directed to a non-absorption-layer mask, it being understood that various types of masks and various processes can benefit from the present invention.

Figure 2:
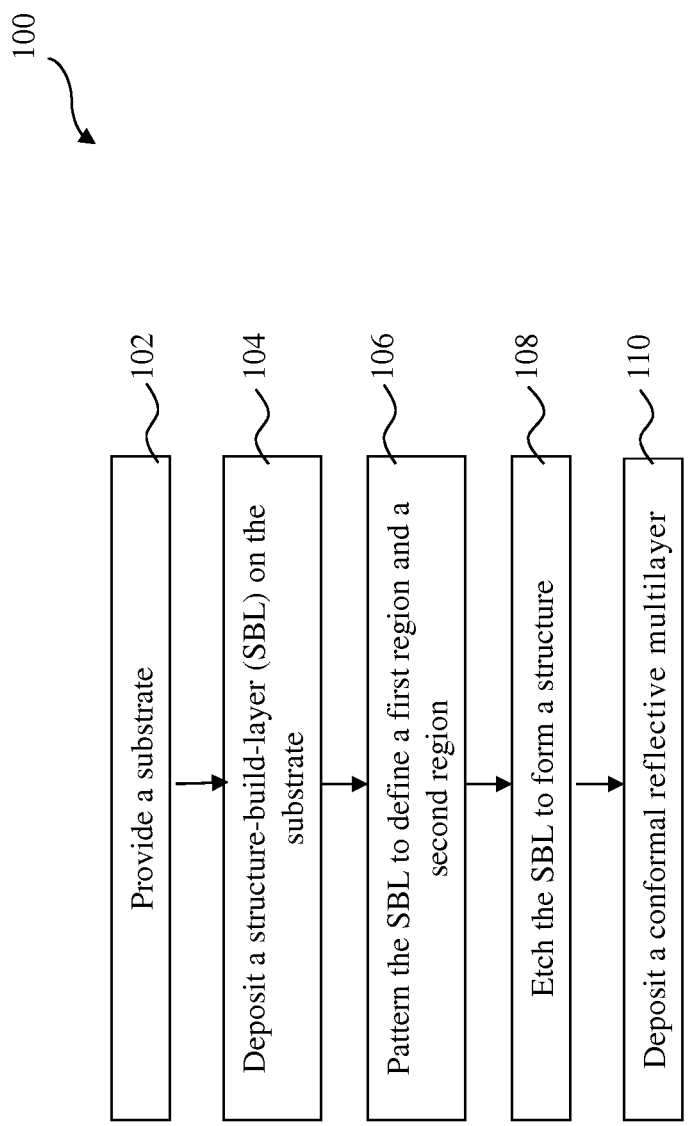
FIG. 2 is a flow chart of a method for fabricating a mask according to various aspects of the present disclosure.
Figure 3:
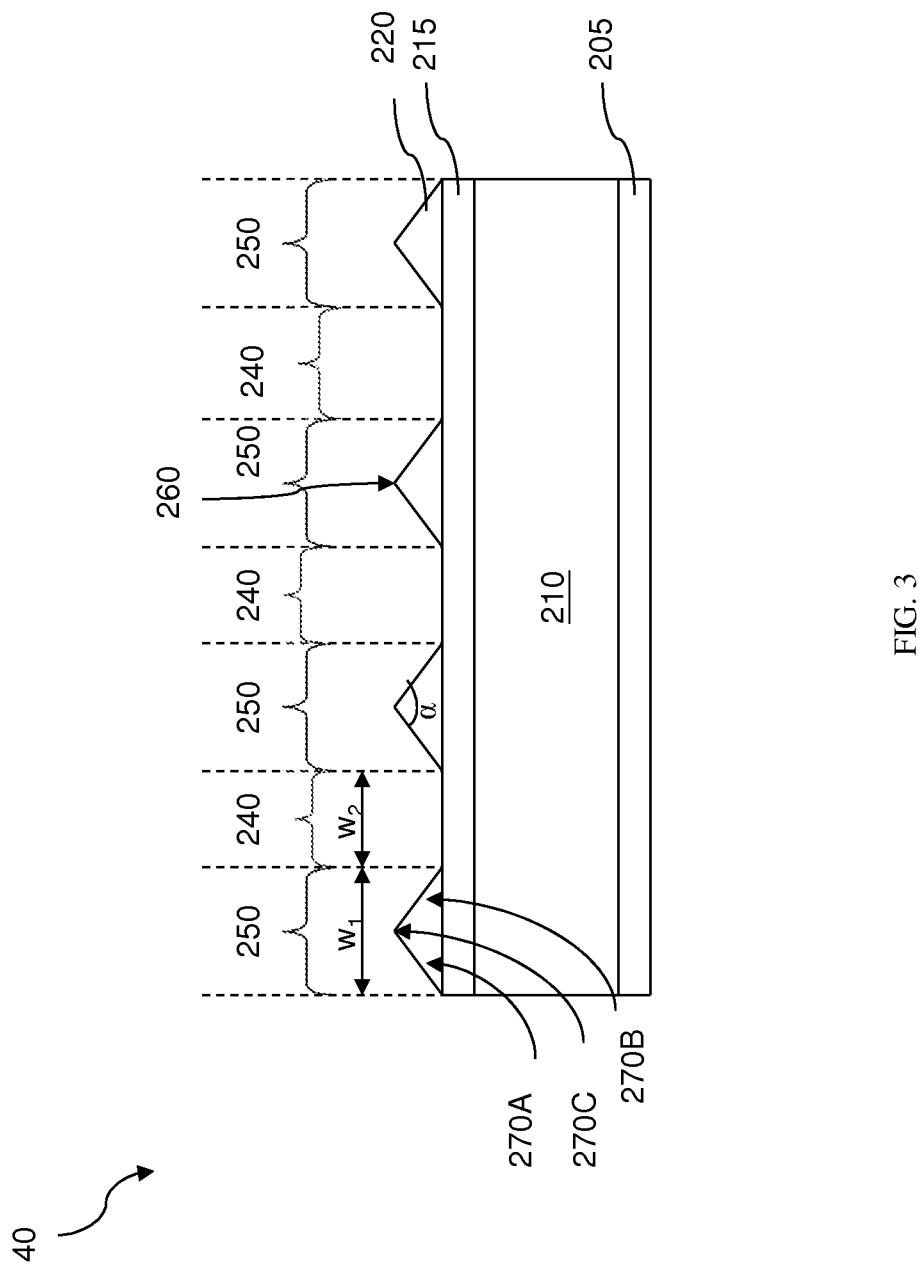
FIG. 3 is a diagrammatic cross-sectional view of a mask according to various aspects of the present disclosure.
Figure 4:
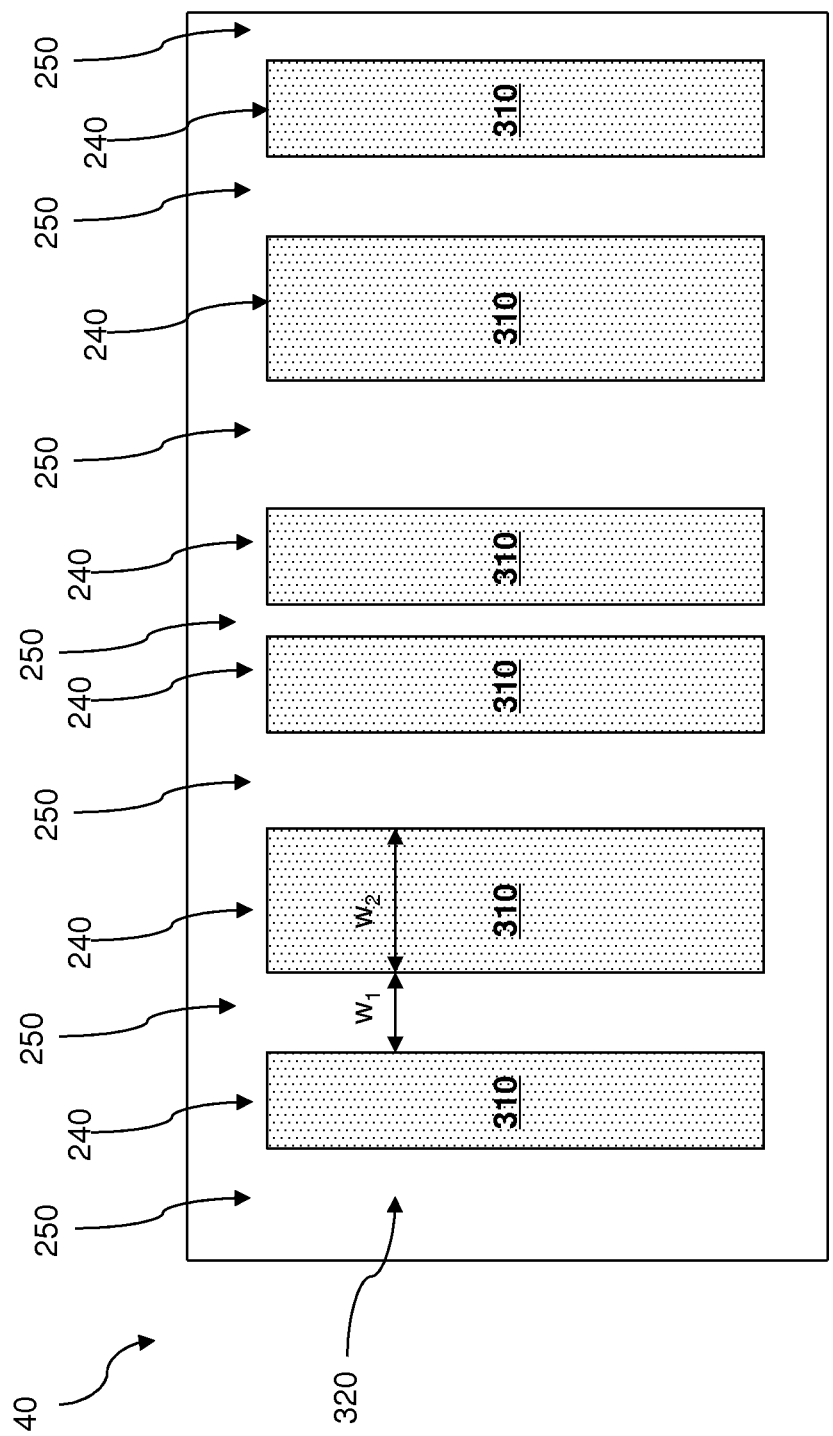
FIG. 4 is a top schematic view of the mask, in portion or entirety, according to various aspects of the present disclosure.
Figure 5:
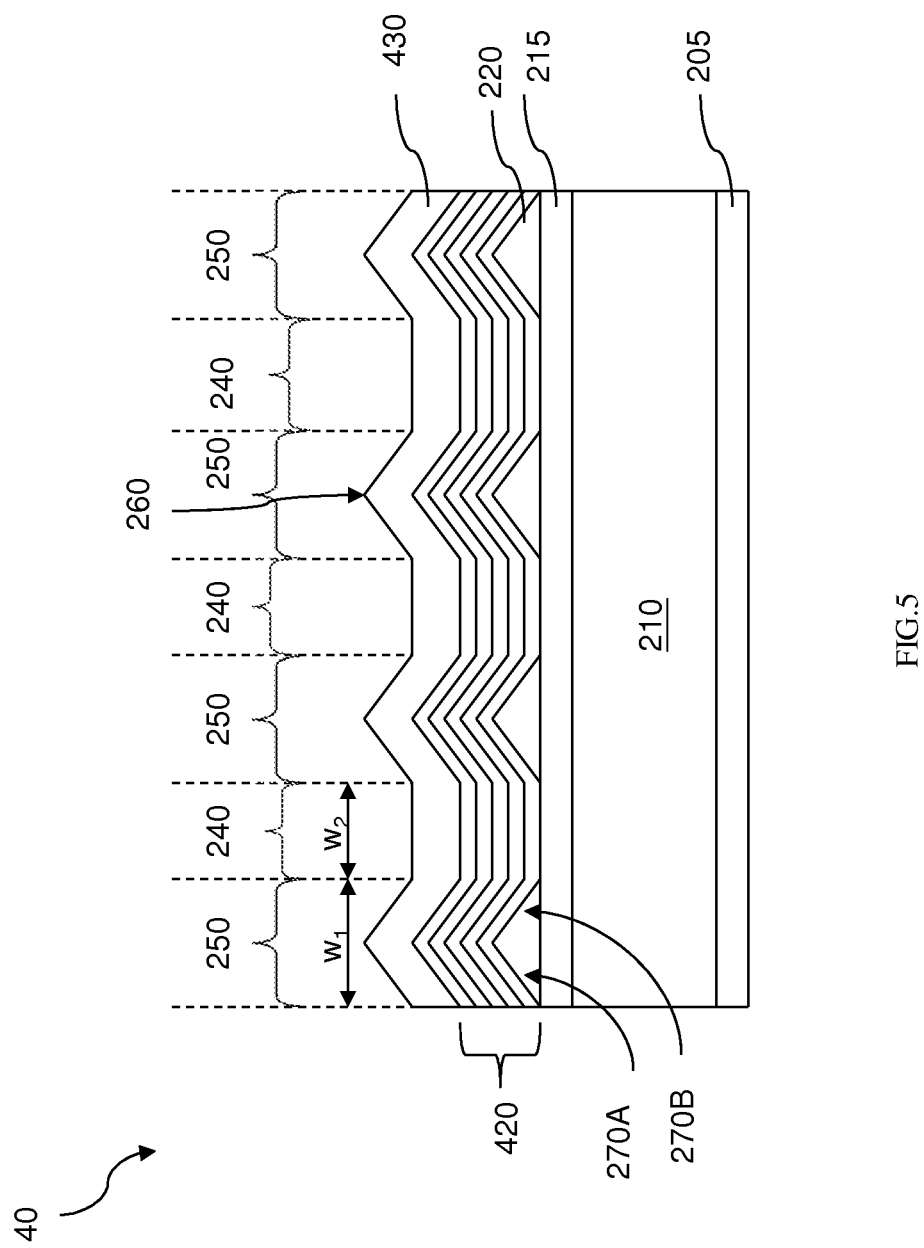
FIG. 5 is a diagrammatic cross-sectional view of a mask according to various aspects of the present disclosure.

FIG. 2 is a flowchart of a method 100 of fabricating a non-absorption-layer mask 40 according to aspects of the present disclosure. FIGS. 3 and 4 are cross-sectional views of one embodiment of the mask 40 at various fabrication stages of the method 100. FIG. 5 is a top schematic view of the EUV mask 40, in portion or entirety, according to various aspects of the present disclosure.

Referring FIGS. 2 and 3, the method 100 begins at step 102 by receiving a substrate 210. The substrate 210 may be made of a low thermal expansion material (LTEM). The substrate 210 may include $TiO_2$ doped $SiO_2$, and/or other low thermal expansion materials known in the art. The LTEM serves to minimize image distortion due to mask heating. The substrate 210 includes materials with a low defect level and a smooth surface.

The method 100 proceeds to step 104 by depositing a structure-build-layer (SBL) 220 over the substrate 210. The SBL 220 includes Si, Mo, $B_4C$, SiC and Zr, or is made directly by the substrate 210. In one embodiment, the SBL 220 is chosen to have an adequate etch selectivity respect to the substrate 210 in a later etch process. In another embodiment, an etch-stop-layer (ESL) 215 is disposed between the SBL 220 and the substrate 210.

In addition, a conductive layer 205 is deposed under (as shown in the figure) the LTEM substrate 210 for electrostatic chucking purpose. In an embodiment, the conductive layer 205 includes chromium nitride (CrN), though other compositions are possible.

One or more of the layers 205, 215 and 220 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

The method 100 proceeds to step 106 by patterning the SBL 220. The SBL 220 is patterned by various suitable techniques. In one embodiment, the SBL 220 is patterned by an e-beam writing technique. First, a photoresist is deposited on the SBL 220 by a spin-on process followed by a soft bake (SB) process. The photoresist may include a positive tone resist or a negative tone resist, and may include a single photoresist layer, or multiple photoresist layers. An e-beam exposure process is performed to the photoresist by an e-beam writer, followed by a developing process to develop the exposed photoresist. The e-beam exposure breaks the polymer in the photoresist into fragments that are dissolved preferentially by a developing solution. The developing solution may remove the exposed or unexposed portions depending on the photoresist type. For a negative-type photoresist, the exposed portions are not dissolved by the developing solution and remain over the substrate. For a positive-type photoresist, the exposed portions would be dissolved by a positive-tone developing solution, leaving the unexposed portions behind. With a negative-tone developing solution, the unexposed portions would be dissolved, leaving the exposed portions. The remaining exposed portions (or unexposed portions) define a pattern.

The method 100 proceeds to step 108 by etching the SBL 220 to form a structure 260. The SBL 220 may be etched by various methods, include a dry etch, a wet etch, or a combination of dry etch and wet etch. The dry etching process may use a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), other suitable gases and/or plasmas, and/or combinations thereof. The etching process may include a multiple-step etching to gain etch selectivity, flexibility and desired etch profile.

In the present embodiment, the SBL 220 is etched to define two regions, a first region 240 and a second region 250, on the substrate 210. The SBL 220 is removed in the first region 240 to expose a flat surface of the substrate 210, or a flat surface of the ESL 215. Meanwhile in the second region 250, the SBL 220 is etched to form the structure 260 having multiple of facets with an angle to each other. In one embodiment, the structure 260 has two facets, 270A and 270B connecting at a vertex 270C with a fixed angle ($\alpha$). The fixed angle ($\alpha$) is in a range from 10 degree to 80 degree. In some embodiments, the vertex 260C has a rounded shape. A first width $w_1$ of the first region 240 may vary from location to location, as well as a second width $w_2$ of the second region 250.

In the present embodiment, the first regions 240 are assigned to polygons 310 and the second regions 250 are signed to a field 320, as shown in FIG. 4.

Referring to FIGS. 2 and 5, the method 100 proceeds to step 110 by forming a conformal reflective multilayer (ML) 420 over the structure 260 and the substrate 210. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The conformal refractive ML 420 includes a plurality of film pairs, such as molybdenum-silicon (Mo/Si) film pairs (e.g., a layer of molybdenum above or below a layer of silicon in each film pair). Alternatively, the conformal refractive ML 420 may include molybdenum-beryllium (Mo/Be) film pairs, or any material that is highly reflective at EUV wavelengths can be utilized for the conformal refractive ML 420. The thickness of each layer of the conformal refractive ML 420 depends on the EUV wavelength and the incident angle. The thickness of the conformal refractive ML 420 is adjusted to achieve a maximum constructive interference of the EUV light reflected at each interface and a minimum absorption of the EUV light by the conformal refractive ML 420. The conformal refractive ML 420 may be selected such that it provides a high reflectivity to a selected radiation type/wavelength. A typical number of film pairs is 20-80, however any number of film pairs is possible. The conformal refractive ML 420 usually achieves a reflectance of 0.65 or above. In an embodiment, the conformal refractive ML 420 includes forty pairs of layers of Mo/Si. Each Mo/Si film pair has a thickness of about 7 nm, with a total thickness of 280 nm. In this case, a reflectivity of about 70% is achieved.

Additionally, a conformal capping layer 430 is disposed above the conformal refractive ML 420 to prevent oxidation of the conformal refractive ML. In one embodiment, the conformal capping layer 430 includes silicon with about 4-7 nm thickness.

In the present embodiment, one or more of the layers 420 and 430 are formed to have similar surface profiles of the first and second regions 240 and 250. One or more of the layers 420 and 430 may be deposited by various methods including atomic layer deposition (ALD), CVD process such as atmospheric pressure CVD (APCVD), low pressure CVD (LPCVD), plasma enhanced CVD (PECVD), or high density plasma CVD (HDP CVD, auto-cloning technique, and/or other methods known in the art.

Additional steps can be provided before, during, and after the method 100, and some of the steps described can be replaced, eliminated, or moved around for additional embodiments of the method 100.

Referring again to FIG. 1, the EUV lithography system and process 10 also employs a projection optics box (POB) 50. The POB 50 may have refractive optics or reflective optics. The radiation reflected from the mask 40 (e.g., a patterned radiation) is collected by the POB 50 and directed to a target 60.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

Figure 6:
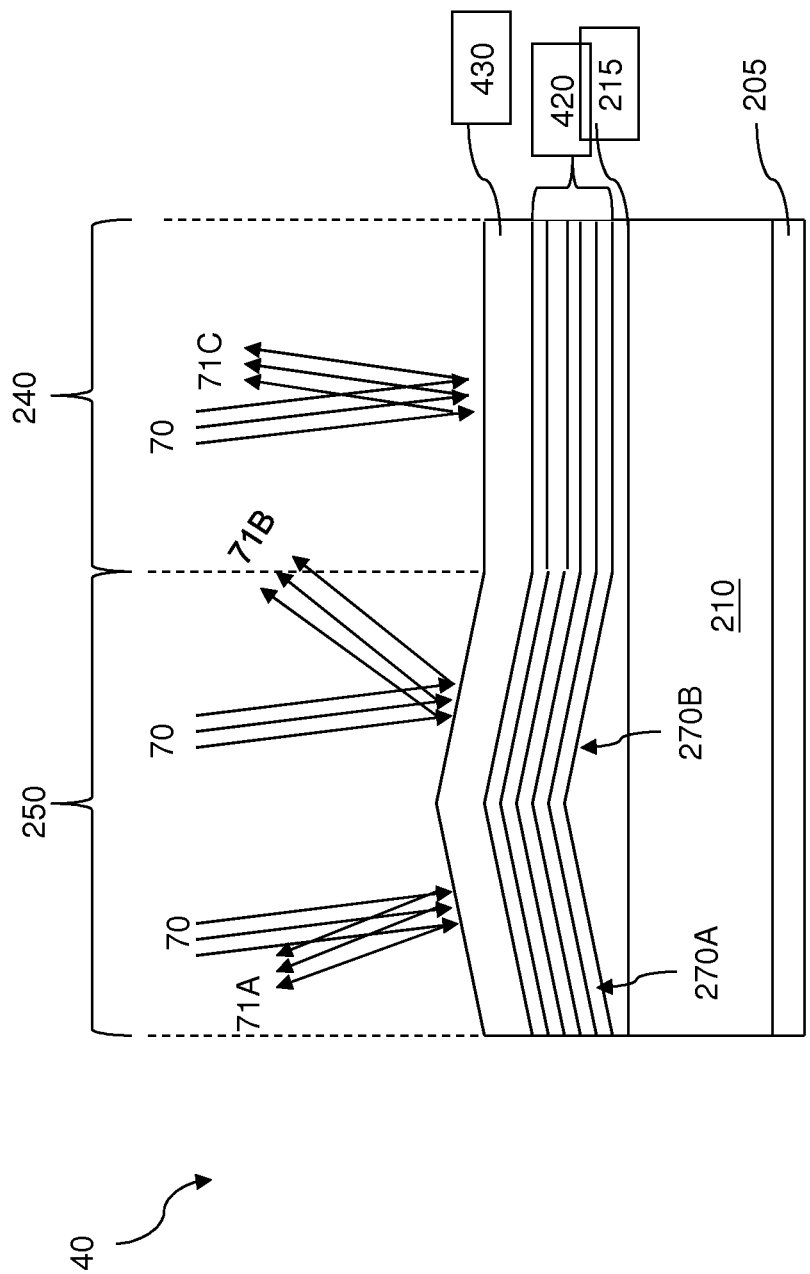
FIG. 6 is a diagrammatic perspective view of the mask according to aspects of the present disclosure.

Referring to FIG. 6, in one embodiment, an incident light ray 70 is reflected from the mask 40. A reflected light from the first region 240 has a first direction 71. Reflected lights from the facets 270A and 270B of the second region have a second and third direction 72, 73, respectively. Due to the surface direction, the first, second and third directions, 71, 72 and 73, are different to each other. In the present embodiment, the POB 50 is configured to collect the reflected light in the first direction 71 and directed it to expose the target 60. The reflected light in other directions, such as 72 and 73 do not be collected by the POB 50 and not be directed to expose the target 60, Based on the above, the present disclosure presents an EUV mask and fabrication. The EUV mask is formed by employing a structure having a multi-facet on a portion of the substrate and having a flat surface on another portion of the substrate. By forming a conformal refractive ML over the structure and the substrate, these different surface profiles are transferred to a surface of the conformal refractive ML. A region of the conformal refractive ML having a flat surface is assigned to a polygon of the EUV mask while another region of the conformal refractive ML having a multi-facet surface is assigned to a field. Instead of using an absorption layer, the EUV mask uses the portion of the conformal refractive ML having a multi-facet surface to distract away a reflected light to expose the target. The EUV mask demonstrates reducing, and/or eliminating shadow effect.

The present disclosure is directed towards masks. In one embodiment, an extreme ultraviolet (EUV) mask includes a low thermal expansion material (LTEM) substrate. The EUV mask has a first region and a second region. The EUV mask also includes a structure disposed in the first region. The structure has a multiple facets with an angle to each other. The EUV mask also includes a conformal reflective multilayer (ML) disposed above the structure in the first region and above the substrate in the second region. The conformal reflective ML has a similar surface profile as the structure in the first region and a flat surface profile in the second region.

The present disclosure is also directed towards lithography systems and processes. In one embodiment, an extreme ultraviolet lithography (EUVL) process includes receiving an extreme ultraviolet (EUV) mask. The EUV mask includes a low thermal expansion material (LTEM) substrate. The substrate has a first region and a second region. The EUV mask also includes a structure disposed in the first region. The structure has a multiple facets with an angle to each other. The EUV mask also includes a conformal reflective multilayer (ML) disposed above the structure in the first region and above the substrate in the second region. The conformal reflective ML has a similar surface profile as the structure in the first region and a flat surface in the second region. The EUVL process also includes assigning the first region to a field (a region without polygons) and a second region to a polygon, exposing the EUV mask by a illumination, collecting and directing a reflected light from the second region of the EUV mask by a projection optics box (POB) to expose a target.

In another embodiment, a method of fabricating a mask includes receiving a low thermal expansion material (LTEM) substrate, depositing a structure-built-layer (SBL) one the substrate, patterning the SBL to define a first region and a second region, etching the SBL to form a structure with multiple facets in the first region and removing the SBL from the second region and depositing a conformal reflective multilayer (ML) over the structure in the first region and over the substrate in the second region.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask, comprising:
   a low thermal expansion material (LTEM) substrate having a first region and a second region;
   a structure disposed in the first region, wherein the structure has a structure profile with multiple facets at an angle to each other; and
   a conformal reflective multilayer (ML) disposed over the structure in the first region and over the LTEM substrate in the second region, wherein the conformal reflective ML has a surface with two profiles, a first profile in the first region similar to the structure profile, and a second, substantially flat profile in the second region.

2. The mask of claim 1, wherein the structure has two facets connecting at a vertex with a fixed angle.

3. The mask of claim 1, wherein the structure includes material of Si, Mo, $B_4C$, SiC and Zr, or is directly made from the substrate.

4. The mask of claim 1, wherein the first region is assigned to a field of the EUV mask.

5. The mask of claim 1, wherein the second region is a polygon of the EUV mask.

6. The mask of claim 1, wherein a width of the first region varies from location to location of the EUV mask.

7. The mask of claim 1, wherein a width of the second region varies from location to location of the EUV mask.

8. The mask of claim 1, further comprising:
a conductive layer over an opposite surface of the LTEM substrate; and
a conformal capping layer disposed over the conformal reflective ML.

9. An extreme ultraviolet lithography (EUVL) process, comprising:
receiving an extreme ultraviolet (EUV) mask, the EUV mask includes:
a low thermal expansion material (LTEM) substrate having a first region and a second region;
a structure disposed in the first region, wherein the structure has multiple facets with an angle to each other; and
a conformal reflective multilayer (ML) disposed over the LTEM structure in the first region and over the LTEM substrate in the second region, wherein the conformal reflective ML has a similar surface profile as the structure in the first region and a substantially flat surface profile in the second region;
assigning the first region to a field (a region without polygons) and a second region to a polygon;
exposing the EUV mask by a illumination; and
collecting and directing a reflected light from the second region of the EUV mask by a projection optics box (POB) to expose a target.

10. The process of claim 9, wherein the structure is formed with two facets connecting at a vertex.

11. The process of claim 9, wherein the structure is formed by a method, the method including:
depositing a structure-built-layer (SBL) over the LTEM substrate;
depositing a photoresist over the SBL;
patterning the photoresist by an electron-beam writer; and
etching the SBL through the patterned photoresist.

12. The process of claim 9, wherein a reflected light from the first region of the EUV mask is not collected and directed to expose the target.

13. An extreme ultraviolet (EUV) mask, comprising:
a low thermal expansion material (LTEM) substrate;
a patterned material layer over the LTEM substrate; and
a conformal reflective multilayer (ML) disposed over the patterned material layer and the LTEM substrate.

14. The EUV mask of claim 13, further comprising a conformal capping layer over the conformal ML.

15. The EUV mask of claim 13, wherein the LTEM substrate has a first region and a second region, and the patterned material layer is disposed in the first region but not in the second region.

16. The EUV mask of claim 13, wherein the LTEM substrate has a first region and a second region, the ML is configured to reflect an incident light in a first direction in the first region and in a second direction in the second region, and the second direction is different from the first direction.

17. The EUV mask of claim 13, wherein the patterned material layer has a non-flat top surface.

18. The EUV mask of claim 13, further comprising an etch stop layer between the LTEM substrate and the patterned material layer.

19. The EUV mask of claim 13, further comprising a conductive layer disposed on a surface of the LTEM substrate opposite of the patterned material layer.

20. The EUV mask of claim 13, wherein the patterned material layer has a top surface that includes multiple facets.

* * * * *